United States Patent [19]
Brady

[11] Patent Number: 5,949,720
[45] Date of Patent: Sep. 7, 1999

[54] VOLTAGE CLAMPING METHOD AND APPARATUS FOR DYNAMIC RANDOM ACCESS MEMORY DEVICES

[75] Inventor: James Brady, Plano, Tex.

[73] Assignee: STMicroelectronics, Inc., Carrollton, Tex.

[21] Appl. No.: 09/183,054

[22] Filed: Oct. 30, 1998

[51] Int. Cl.[6] .................................................. G11C 7/00
[52] U.S. Cl. ............................ 365/189.06; 365/189.09; 365/189.11
[58] Field of Search .................... 365/189.06, 189.11, 365/189.09, 203

[56] References Cited

U.S. PATENT DOCUMENTS 5,777,934  7/1998  Lee et al. ............................. 365/203
5,781,497  7/1998  Patel et al. .......................... 365/230.06

*Primary Examiner*—Andrew Q. Tran
*Attorney, Agent, or Firm*—Theodore E. Galanthay; Lisa K. Jorgenson; Andre Szuwalski

[57] ABSTRACT

A circuit for clamping the voltage appearing on the bit lines of a dynamic random access memory (DRAM) device so that the voltage thereon is maintained above the low reference voltage source. The circuit includes pull-up devices connected to the bit lines of the DRAM device. The pull-up devices are active only when pull-down devices connected to the bit lines pull some of the bit lines towards the low reference voltage level.

25 Claims, 6 Drawing Sheets

VOLTAGE CLAMPING METHOD AND APPARATUS FOR DYNAMIC RANDOM ACCESS MEMORY DEVICES

CROSS REFERENCE TO RELATED APPLICATION

The present invention is related to co-pending patent application entitled "Method and Apparatus for Bit Line Isolation For Random Access Memory Devices", filed Oct. 30, 1998, Ser. No. 09/183,074.

BACKGROUND OF THE INVENTION

TECHNICAL FIELD OF THE INVENTION

The present invention relates to a control method and device for dynamic random access memory (DRAM), and particularly to a method and device for limiting voltages appearing on the bit lines of a DRAM device.

BACKGROUND OF THE INVENTION

There are two known types of semiconductor memory, one referred to as volatile memory and the other referred to as non-volatile memory. In volatile memories the stored data is lost when the power supply is removed from the semiconductor device. A non-volatile memory, on the other hand, retains the data stored for extended periods after the power supply to the device has been removed. In a computer or related systems, non-volatile memory is used for long-term storage of programs and data which seldom or never changes, and volatile memory devices are used for the short-term storage of program instructions and data during the execution of a program.

Volatile memory devices may be divided into two categories. Static Random Access Memory (SRAM) consists of flip-flop latches such that each SRAM latch maintains a bit of data so long as power is provided to the SRAM. In dynamic memories, a charge representing a data bit is stored on a capacitor.

The core of a DRAM is typically partitioned into arrays or blocks of memory cells, with each array including a plurality of rows of memory cells and with the cells in each row being connected to a respective one of a plurality of word lines. Memory cells in each column of cells in an array are connected to a respective one of a plurality of bit lines. Bit lines are grouped in pairs such that when data from a memory cell is read onto a first bit line of a bit line pair, the second bit line of the bit line pair is provided with a voltage level that is representative of a signal between a low logic level and a high logic level, relative to the amount of charge that can be placed thereon by a charge stored in a memory cell. This difference in voltage levels between the bit lines of the bit line pair is the differential to which an associated sense amplifier operatively responds.

Sense amplifiers are typically connected to the bit lines of dynamic memory to sense the small change in potential appearing on the bit lines following a memory cell read operation and to drive the bit lines to the appropriate full reference voltage level, such as Vdd or Vss. Once the sense amplifier drives the bit line to the full reference voltage level, the memory cell from which data was read is refreshed with the full reference voltage signal appearing on the bit line.

Conventional DRAM cells employ a single transistor architecture wherein the memory cell comprises a storage capacitor having a first terminal connected to a reference voltage, and a second terminal connected to a pass and/or transmission gate transistor. The pass gate transistor serves to transport charge to the storage capacitor, and also to read the charged or uncharged state of the storage capacitor. The gate electrode of the pass/transmission gate transistor is tied to a word line decode signal and the drain electrode thereof is connected to a bit line. Data is stored in the memory cell as a charge on the storage capacitor. However, because data is stored in a dynamic memory cell as a charge on a capacitor and because memory cells experience leakage current either from the storage capacitor or the pass gate transistor, the stored charge in a dynamic memory cell, particularly a stored charge representing a high logic level, decays over time.

Dynamic memories are created in a number of ways. Dynamic memories that are available as stand-alone, off-the-shelf memory chips are typically fabricated by a process which is specifically tailored to provide optimal DRAM performance. Dynamic memories that are embedded within an integrated circuit chip, however, are commonly fabricated by a process that is not tailored for optimal DRAM performance, but is instead tailored to provide optimal chip-wide performance, such as a process that is suited for size and/or speed considerations. As such, dynamic memories that are embedded within an integrated circuit having other circuitry, such as an application specific integrated circuit (ASIC) or a microprocessor chip, incur complications and limitations that are not experienced in dynamic memories fabricated by a DRAM-tailored process.

For instance, semiconductor fabrication processes that are tailored for overall performance of an ASIC typically utilize thinner gate oxides relative to gate oxide thicknesses in DRAM-tailored processes. In addition, DRAM-tailored designs typically utilize back gate bias which is not necessarily employed in ASIC designs. These and other differences lower the threshold voltage of the transistors on the ASIC chip relative to threshold voltages on a chip tailored for optimal DRAM performance. Consequently, for a given gate-source voltage (Vgs), the sub-threshold leakage current for a transistor in an ASIC chip will be greater than a sub-threshold leakage current for a transistor in an integrated circuit fabricated by a DRAM-tailored process. This leakage current increase for a transistor in an ASIC process is of a particular concern for embedded DRAM devices. Because data is stored in a dynamic memory cell by a stored charge and dynamic memory storage capacitors are typically quite small to achieve relatively high density, a dynamic memory cell may be relatively quickly discharged if sub-threshold leakage currents are not sufficiently controlled, thereby potentially corrupting the data stored in the memory device.

Accordingly, there is a need for a device and method for maintaining sub-threshold leakage current levels associated with memory cells of embedded dynamic memory devices within acceptable limits, taking into consideration memory speed, size constraints and robustness of operation for the embedded dynamic memory device.

SUMMARY OF THE INVENTION

The present invention overcomes shortcomings associated with dynamic memory devices embedded within an integrated circuit chip and satisfies a need for a dynamic memory device which effectively controls leakage current levels.

According to the present invention, there is provided a voltage limiting circuit for dynamic memories embedded within integrated circuit chips, such as an ASIC. The voltage limiting circuit includes a pull-up device associated with a bit line of the dynamic memory device. A pull-up device is preferably connected to each bit line. Each pull-up device is preferably dimensioned to weakly pull its corresponding bit line towards the high reference voltage level, relative to the drive strength of the sense amplifier connected to the bit line to pull the bit line to the low reference voltage level. Due to the presence of the pull-up devices on the bit lines, a sense amplifier or memory input-output (I/O) circuitry is unable to pull a bit line completely to the low reference voltage level. Consequently, the pass transistors of unaccessed memory cells (memory cells in a row of memory cells that is not being written into or read from so that the corresponding memory cell pass transistors remain turned off) connected to a bit line pulled low by a sense amplifier exhibit less sub-threshold leakage current, thereby better maintaining a stored charge representing a high logic level in the memory cell.

In a preferred embodiment of the present invention, the pull-up device comprises two field-effect transistors arranged in a series stacked relation. A first transistor is employed to prevent its respective bit line from being driven to the low reference voltage level, and the second transistor is employed to selectively couple the first transistor to the bit line.

BRIEF DESCRIPTION OF THE DRAWINGS

A more complete understanding of the present invention may be had by reference to the following detailed description when taken in conjunction with the accompanying drawings wherein.

DETAILED DESCRIPTION OF THE PREFERRED EMBODIMENT

Figure 1:
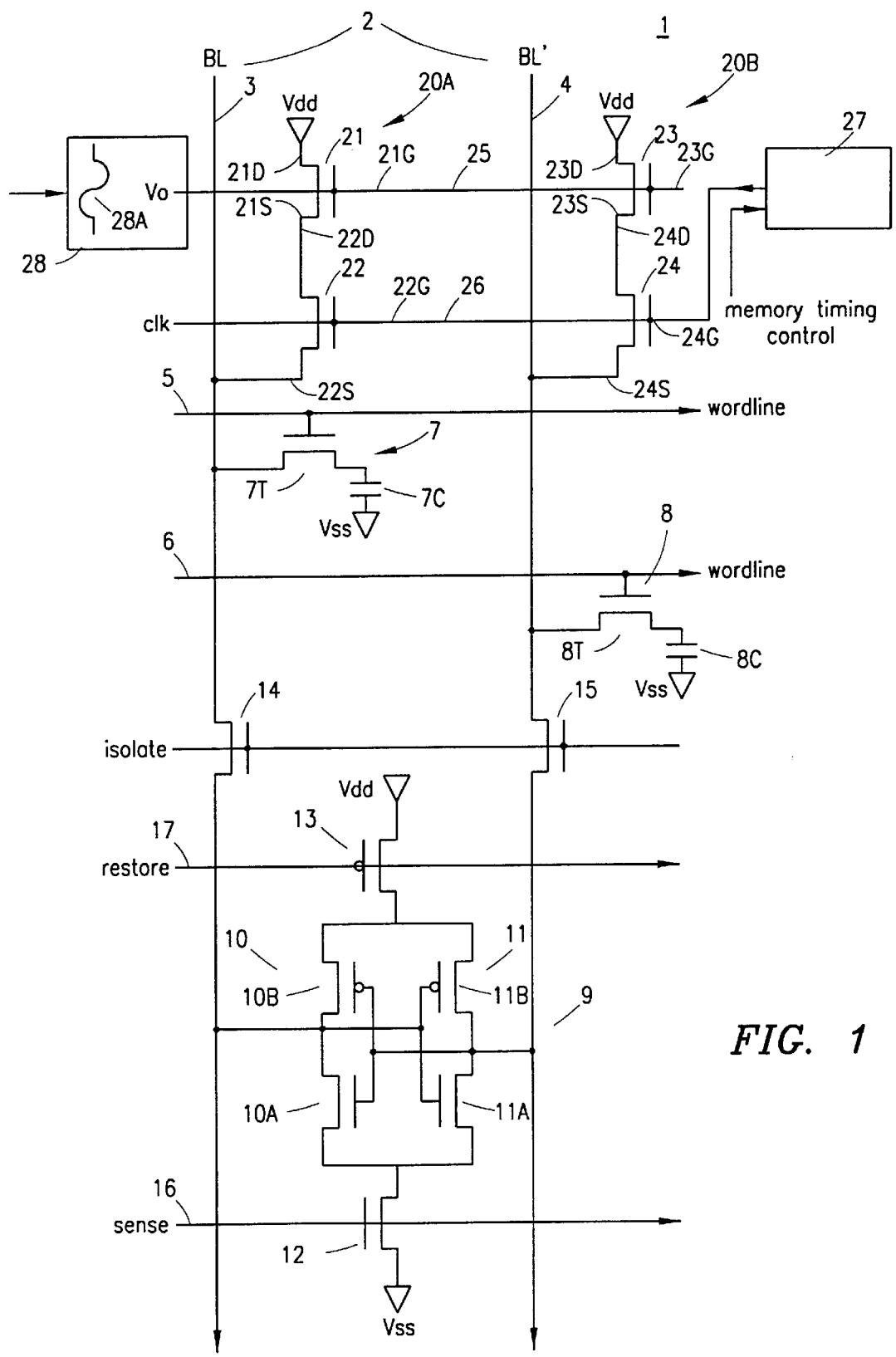
FIG. 1 is a circuit diagram of a preferred embodiment of the present invention in association with a dynamic memory device.

Referring to FIG. 1, there is disclosed a voltage limiting circuit 1 for a dynamic memory device embedded within an integrated circuit chip, such as an ASIC chip.

The dynamic memory device includes bit line pair 2 having bit lines 3 and 4, and word lines 5 and 6. Dynamic memory cell 7 is connected to bit line 3 and word line 5 such that activating word line 5 turns on pass transistor 7T of memory cell 7, thereby electrically connecting bit line 3 to storage capacitor 7C of memory cell 7. Similarly, dynamic memory cell 8 is connected to bit line 4 and word line 6 such that activating word line 6 turns on pass transistor 8T of memory cell 8, thereby electrically connecting bit line 4 to storage capacitor 8C of memory cell 8.

The dynamic memory device further includes sense amplifier 9 connected to bit lines 3 and 4. Sense amplifier 9 comprises cross-coupled invertors 10 and 11 which are connected to the low reference voltage level (Vss) via pass transistor 12 and to the high reference voltage level (Vdd) via pass transistor 13. Sense amplifier 9, when connected to Vdd and Vss during reading of the memory cells 7 or 8, senses a charge differential appearing on bit lines 3 and 4 and drives bit lines 3 and 4 to opposite reference voltage levels. Pass transistors 14 and 15 are disposed between sense amplifier 9 and bit lines 3 and 4, respectively, of the bit line pair 2 in order to selectively isolate the sense amplifier 9.

Voltage limiting circuit 1 includes pull-up devices or circuits 20A and 20B which are connected to bit lines 3 and 4, respectively. Pull-up devices 20A and 20B preferably selectively pull their respective bit lines towards the high reference voltage level. Pull-up devices 20A and 20B each comprise a pair of series stacked transistors. Pull-up device 20A includes clamping transistor 21 having its drain electrode 21D connected to Vdd and its gate electrode 21G connected to fixed voltage line 25; and switching transistor 22 having its source 22S connected to bit line 3 and its drain 22D connected to the source 21S of transistor 21. Similarly, pull-up device 20B includes clamping transistor 23 having its drain electrode 23D connected to Vdd and its gate electrode 23G connected to fixed voltage line 25, and switching transistor 24 having its source electrode 24S connected to bit line 4 and its drain electrode 24D connected to the source electrode 23S of clamping transistor 23.

In order to avoid corrupting a charge placed on a bit line 3 or 4 when reading data from a memory cell, pull-up devices 20A and 20B are dynamic pull-up devices. Gate electrode 22G of transistor 22 and gate electrode 24G of transistor 24 are connected to a common clock line 26. Clock line 26 is controlled to turn on transistors 22 and 24 only at specific times during normal operation of the dynamic memory device, as explained below. Fixed voltage line 25 is preferably driven to a voltage level, such as Vdd, so that clamping transistors 21 and 23 are always turned on.

Transistors 21–24 preferably comprise n-channel field-effect transistors, but alternatively transistors 21–24 comprise other components, such as p-channel field-effect transistors. The employment of n-channel field-effect transistors is particularly advantageous because of the ability of n-channel field-effect devices to more closely track the operation of n-channel transistors 10A, 11A and 12 within sense amplifier 9 over variations in the fabrication process.

Clamping transistors 21 and 23 prevent bit lines 3 and 4, respectively, from being driven to the low reference voltage level (Vss) when sense amplifier 9 or any other circuit having pull-down devices, such as input-output (I/O) circuitry (not shown), connected to bit lines 3 and 4 drives either of bit lines 3 or 4 to Vss. By maintaining the voltage appearing on bit lines 3 and 4 above the low reference voltage level, the sub-threshold leakage current associated with each memory cell connected to the driven bit line that is turned off (not accessed) is decreased. In other words, maintaining the voltage level on bit lines 3 and 4 above Vss reduces the leakage current through the transistors of those memory cells which are connected to bit lines 3 and 4 and are turned off so as to block electrical communication between bit lines 3 and 4 and the memory cells.

Clamping transistors 21 and 23 effectively then form voltage divider circuits with pull-down devices that are connected to bit lines 3 and 4, respectively, when those pull-down devices drive a bit line 3 or 4 towards Vss. Specifically, the impedance of clamping transistors 21 and 23 when turned on combines with the impedance of the pull-down devices driving bit line 3 or 4 towards Vss, such as transistors 10A, 11A and 12 of sense amplifier 9, to form a resistive circuit between Vdd and Vss such that the voltage appearing between clamping transistors 21, 23 and the pull-down devices, including the bit line 3 or 4 driven towards Vss, is clamped at a voltage level above Vss but less than a voltage level that may undesirably trigger sense amplifier 9 into a different state.

Figure 2:
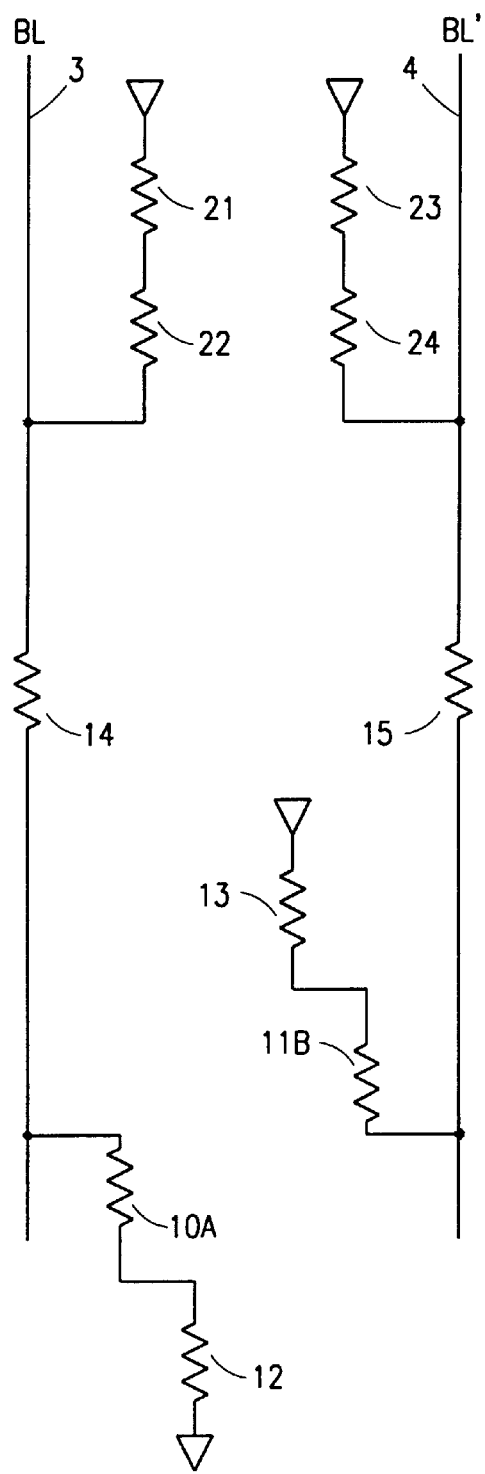
FIG. 2 is an equivalent circuit for the circuit diagram shown in FIG. 1 during execution of a read operation.

FIG. 2 illustrates a resistive circuit equivalence for the circuit of FIG. 1 for the case in which sense amplifier 9 drives bit line 3 towards Vss and bit line 4 towards Vdd. This situation may occur, for example, when sense amplifier 9 senses data representing a logic low level placed on bit line 3 or data representing a logic high level placed on bit line 4, and begins to drive bit lines 3 and 4 accordingly. Bit line 3 is driven towards Vss due to pull-down devices 10A and 12 of sense amplifier 9 being turned on. Bit line 4 is driven towards Vdd by pull-up transistors 11B and 13 of sense amplifier 9 being turned on. Representing each turned on transistor as a resistance and ignoring the resistive contribution by the high impedance, turned off transistors, a resistive current path is formed between Vdd and Vss through pull-up transistors 21 and 22, isolation transistor 14, sense amplifier pull-down device 10A and pass transistor 12, with bit line 3 being disposed between transistors 21, 22 and isolation transistor 14. Clamping transistor 21 is suitably sized and/or biased relative to transistors 10A, 12, 14 and 22 so that when transistors 10A, 12, 14, 21 and 22 are turned on, the voltage appearing on bit line 3 may be set to a voltage level greater than Vss but less than a voltage level that may corrupt data represented thereby.

Accordingly, clamping transistors 21 and 23 are preferably sized and/or biased so that their turned on impedances result in bit lines 3 and 4 being provided a minimum voltage of, for example, a few tenths of a volt. It has been observed in some ASIC-tailored processes that, concerning an increase in the difference in voltage between the gate and source electrodes (Vgs) for a turned off n-channel transistor with the gate voltage thereof being more negative than the source voltage, a change of less than a tenth of a volt will reduce sub-threshold leakage current through the n-channel transistor by an order of magnitude. This use of pull-up devices 20A and 20B to increase the minimum voltage appearing on bit lines 3 and 4 by a few tenths of a volt will result in a significant reduction in leakage current in those memory cell transistors 7T and 8T that are turned off when their respective bit lines 3 and 4 are pulled towards Vss. By way of one example, the minimum voltage appearing on bit lines 3 and 4 due to the presence of pull-up devices 20A and 20B is approximately between 0.3 v and 0.5 v. Consequently, pull-up devices 20A and 20B, and in particular clamping transistors 21 and 23, weakly pull bit lines 3 and 4, respectively, towards Vdd, relative to the drive strength of sense amplifier 9 to pull bit lines 3 and 4 to Vss.

Switching transistors 22 and 24 are activated by clock circuitry 27 to selectively couple clamping transistors 21 and 23 to bit lines 3 and 4, respectively. Switching transistors 22 and 24 thus act as transmission gate switches in providing electrical connections to clamping transistors 21 and 23. The presence of switching transistors 22 and 24 in pull-up devices 20A and 20B, respectively, allows clamping transistors 21 and 23 to have a fixed voltage tied to their gate electrode. A voltage source driving clamping transistors 21 and 23, then, can be generated much more simply without having to supply switching currents.

Accordingly, a relatively simple voltage source 28 may be preferably employed to drive fixed voltage line 25 to a desired voltage level. The voltage level may be chosen in order to bias clamping transistors 21 and 23 so that bit lines 3 and 4 are clamped at the desired minimum voltage level. In addition, voltage source 28 may be programmable so that the voltage clamping function of the present invention, and particularly voltage source 28, may be tailored for each individual memory device. For instance, voltage source 28 may include at least one blowable fuse 28A or programmed signals which may be manipulated and/or configured so that voltage source 28 generates the desired output voltage level.

Switching transistors 22 and 24 are preferably activated whenever a pull-down transistor connected to bit lines 3 and 4 pulls bit lines 3 or 4 towards the low reference voltage level. Activating switching transistors 22 and 24 prior to the time pull-down devices pull down either bit line 3 or 4 may corrupt data appearing on bit lines 3 and 4. Activating switching transistors 22 and 24 well after pull-down devices pull either bit line 3 or 4 towards Vss causes the voltage appearing on bit line 3 or 4 to drop to Vss, thereby resulting in unwanted leakage current levels potentially discharging data stored in memory cells 7 and 8. Accordingly, clocking circuitry 27 preferably includes timing circuitry (not shown) which is triggered by memory control signals to activate switching transistors 22 and 24 shortly after pull-down devices connected to bit lines 3 and 4, such as pull-down devices 10A, 11A and 12 of sense amplifier 9, initially pull either bit lines 3 or 4 towards Vss. Such activation electrically connects clamping transistors 21 and 23 to bit lines 3 and 4, respectively, which clamps voltage levels thereon above Vss. Clocking circuitry 27 maintains switching transistors 22 and 24 activated until those pull-down devices no longer pull bit lines 3 or 4 towards Vss. For example, clocking circuitry 27 may utilize, among other memory control signals, restore signal 17 to trigger the activation of pull-up devices 20 and 21.

Figure 3:
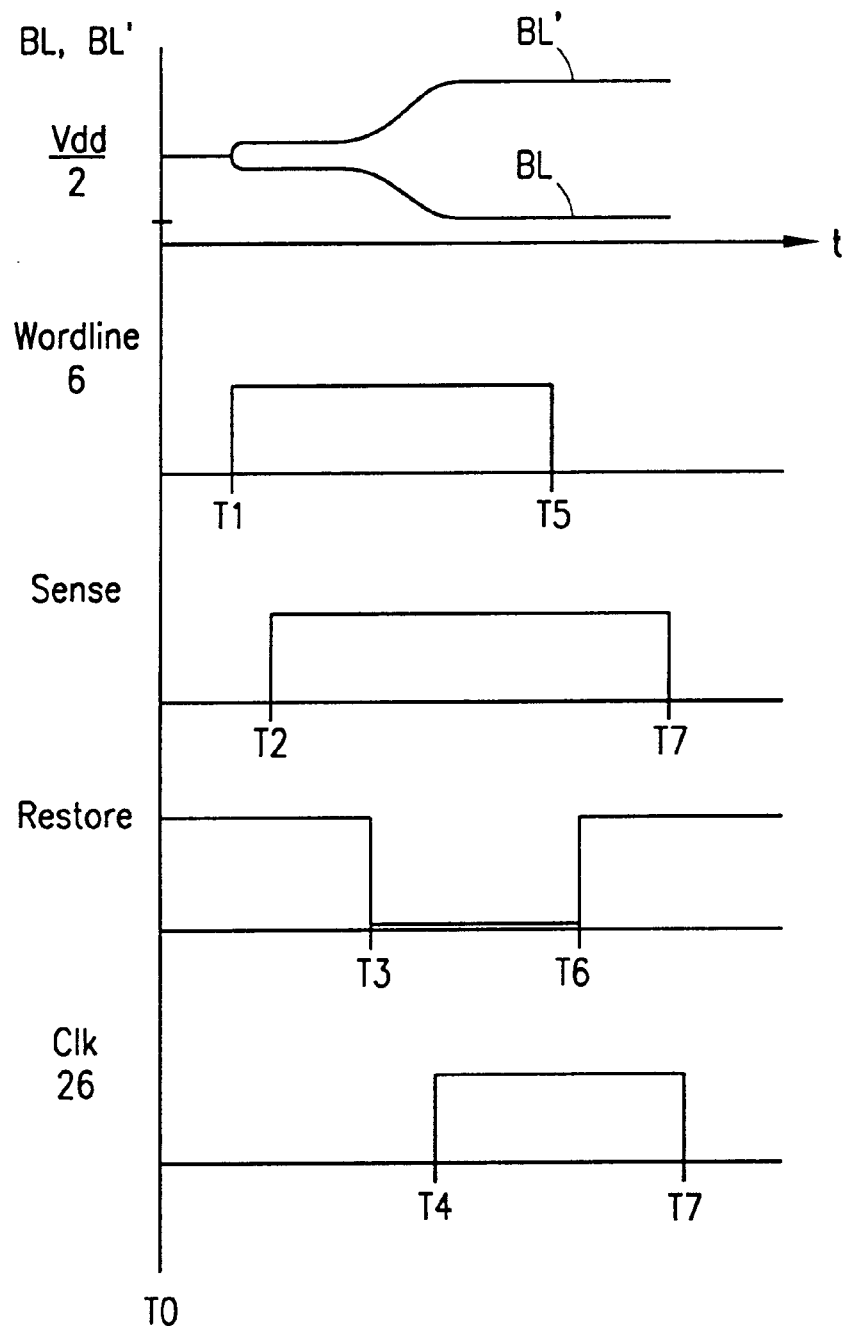
FIG. 3 is a timing diagram illustrating the execution of a read operation for a dynamic memory device utilizing the present invention.

FIG. 3 illustrates the timing involved in executing a read operation from memory cell 8 of the dynamic random memory device. At time T0, bit lines 3 and 4 are equalized and precharged to an intermediate voltage level, such as Vdd/2, using known techniques. At this time, word lines 5 and 6 are driven to Vss so that all memory cell storage capacitors are isolated from bit lines 3 and 4. Sense line 16 is driven to Vss and restore signal 17 is driven to Vdd at time T0 to turn off sense amplifier 9.

At time T1, word line 6 is driven to Vdd to connect its respective row of memory cells to the bit lines. Word line 5 (not shown in FIG. 3) remains driven to Vss throughout the memory read operation. At this time, memory cell transistor 8T is turned on which causes the charge stored on memory cell capacitor 8C to be shared between memory cell capacitor 8C and bit line 4. Consider the case wherein a charge representing a high logic level is stored on memory capacitor 8C. Following time T1, the voltage appearing on bit line 4 (BL') is slightly greater than the voltage appearing on bit line 3 (BL) due to the charge stored in memory cell 8 being greater than the charge stored in a dummy memory cell (not shown) coupled to bit line 3. A charge differential is thus created between bit lines 3 and 4. At time T2, sense line 16 is driven towards Vdd which turns on transistor 12 of sense amplifier 9. Shortly thereafter, restore line 17 is driven towards Vss which turns on transistor 13 of sense amplifier 9 at time T3. At this time, sense amplifier 9 is fully powered, thereby enabling sense amplifier 9 to sense the charge differential appearing on bit lines 3 and 4 and to drive bit line 3 towards Vss and bit line 4 towards Vdd.

Sense amplifier 9 is connected to Vss before being connected to Vdd to account for Vdd bussing being generally more noisy than Vss bussing within the integrated circuit.

Especially for ASIC chips in which noise appearing on Vdd may occur asynchronously and/or at irregular times relative to the timing of events within the embedded DRAM devices, the sense amplifiers of an embedded DRAM are first connected to Vss to ensure that noise appearing on Vdd is less likely to corrupt data appearing on bit lines 3 and 4 when sense amplifier 9 is initially connected to the high and low reference voltage levels. Alternatively, sense line 16 and restore line 17 may be driven towards Vdd and Vss, respectively, at the same time.

At or around time T3 and after sense amplifier 9 has sufficiently sensed the charge differential appearing on bit lines 3 and 4, bit line 3 is driven towards Vss and bit line 4 towards Vdd by sense amplifier 9. Pull-down devices 10A and 12 then commence driving bit line 3 towards Vss. Prior to the voltage appearing on bit line 3 from reaching Vss, clock circuitry 27, triggered by memory control signals such as restore line 17, drives clock line 26 towards Vdd at time T4, which turns on switching transistors 22 and 24. Once switching transistors 22 and 24 are turned on, clamping transistors 21 and 23 are connected to bit lines 3 and 4, respectively, and begin to relatively weakly pull bit lines 3 and 4 towards Vdd. At this time, clamping transistor 21 combines with transistors 10A and 12 of sense amplifier 9 to form a voltage divider circuit, thereby preventing the voltage appearing on bit line 3 from reaching Vss. Since pull-up transistors 11B and 13 are already driving bit line 4 towards Vdd, clamping transistor 23 being turned on has little effect on bit line 4.

The read operation is completed by driving word line 6 to Vss at time T5, which isolates its corresponding memory cells, including memory cell 8, from the bit lines. At this time, the data previously stored in memory cell 8 has been refreshed by storing therein an amount of charge corresponding to Vdd. Thereafter, sense amplifier 9 and pull-up devices 20A and 20B are deactivated by restore line 17 being driven to Vdd at time T6, followed by sense line 16 and clock line 26 being driven to Vss at time T7.

Figure 4:
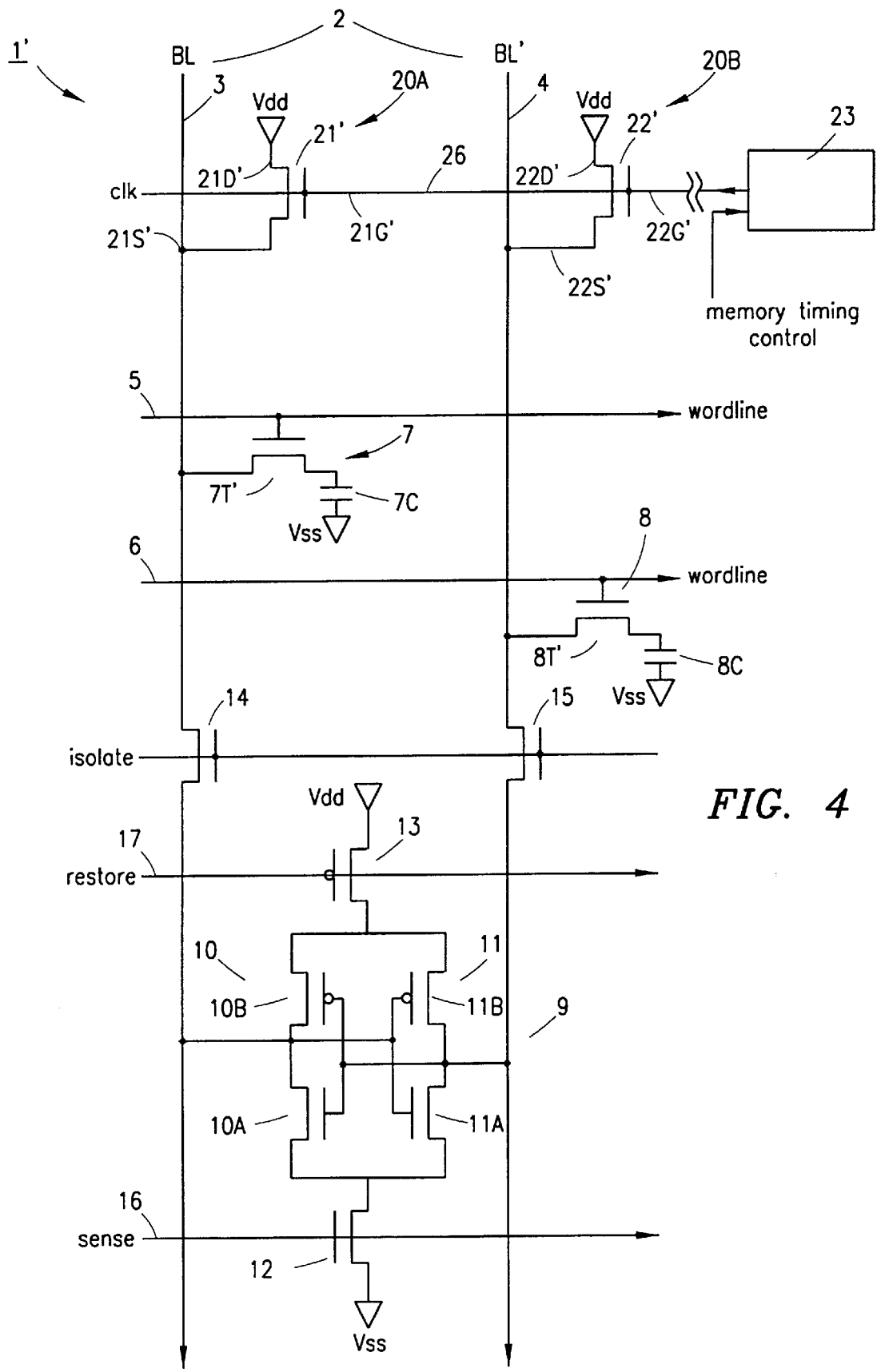
FIG. 4 is a circuit diagram of another embodiment of the present invention in association with a dynamic memory.

In another embodiment of the present invention, pull-up devices 20A and 20B of voltage clamping circuit 1' (FIG. 4) includes clamping transistors 21' and 22' whose source electrodes, 21S' and 22S', respectively, are tied to bit lines 3 and 4, respectively. Drain electrodes 21D' and 22D' of clamping transistors 21' and 22', respectively, are connected to Vdd. In order to provide dynamic pull-up devices, gate electrodes 21G' and 22G' are connected to memory timing circuitry 23. With memory timing circuitry 23 triggered to drive clock signal 26 whenever a bit line 3 or 4 is driven towards Vss as discussed above, clamping transistors 21' and 22' are selectively activated to pull bit lines 3 and 4, respectively, towards Vdd when clock signal 26 is driven to same.

Clamping transistors 21' and 22' are preferably sized to relatively weakly pull up bit lines 3 and 4, respectively, as described above. In this way, clamping transistors 21' and 22' clamp and/or maintain bit lines 3 and 4, respectively, to voltage levels above Vss, thereby reducing sub-threshold leakage currents in memory cells which are coupled to bit lines 3 and 4.

Figure 5:
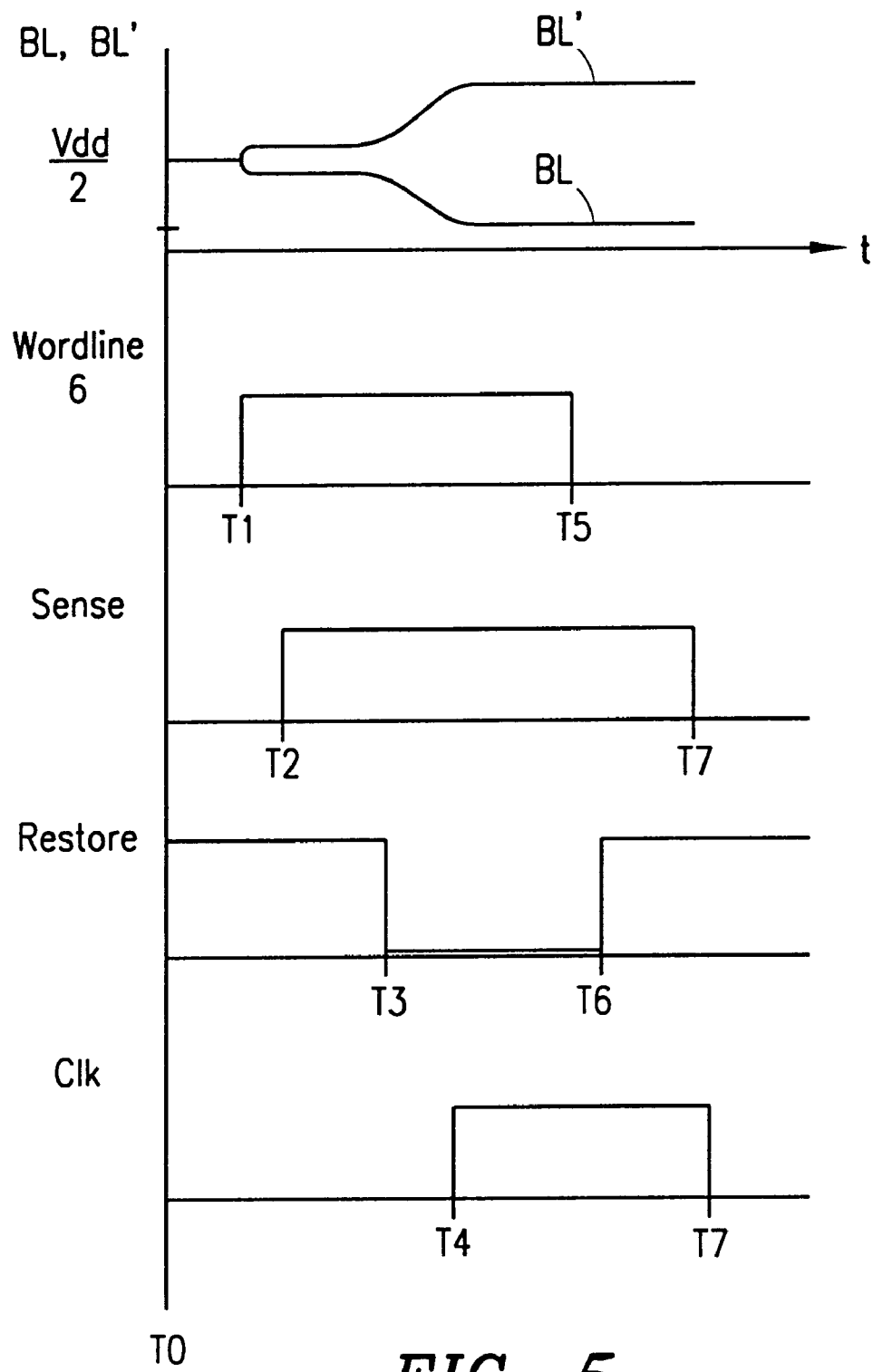
FIG. 5 is a timing diagram illustrating the execution of a read operation for the embodiment shown in FIG. 4.

The operation of voltage clamping circuit 1' closely follows voltage clamping circuit 1 according to the preferred embodiment of the present invention. At time T0 (FIG. 5), bit lines 3 and 4 are precharged and equalized. At time T1 wordline 6 may be driven to Vdd which couples memory cell 8 to bit line 4. Assuming a high logic level being stored in memory cell 8, bit line 4 increases slightly above the precharged level. When sense amplifier 9 is turned on at time T3, bit line BL' 4 is driven towards Vdd and bit line 3 towards Vss. Prior to the voltage appearing on bit line 3, clock circuitry 23 drives clock line 26 towards Vdd at time T4, which turns on clamping transistors 21' and 22'. At this time, clamping transistor 21' combines with transistors 10A and 12 of sense amplifier 9 to form a voltage divider circuit, thereby preventing the voltage appearing on bit line 3 from reaching Vss. Bit line 3 remains clamped at a minimum voltage above Vss throughout the remainder of the memory read cycle.

The operation of voltage limiting circuits 1 and 1', in accordance with the preferred embodiments of the present invention, is described above in connection with sense amplifier 9 and its pull-down transistors 10A, 11A and 12 being operatively connected between bit line 3 and 4 and Vss. It is understood that the voltage limiting circuits may be similarly utilized in conjunction with other circuitry which may pull either bit line 3 or 4 towards Vss, such as data I/O circuitry (not shown) for the DRAM device. In this regard and with respect to the first preferred embodiment of the present invention discussed above, clock circuitry 27 is timed to drive clock line 26 to Vdd to turn on switching transistors 22 and 24 whenever a bit line 3 or 4 is pulled towards Vss.

The present invention is described above in association with a single bit line pair 2 of a dynamic memory device. It is understood that the present invention may be preferably associated with each bit line pair of a dynamic memory device. In this case, a pair of pull-up devices 20A and 20B may be connected to the bit lines of a distinct bit line pair 2 such that each bit line pair 2 is connected to a distinct pair of pull-up devices 20A and 20B. Consequently, sub-threshold leakage current from each memory cell in a dynamic memory device may be effectively controlled.

Figure 6:
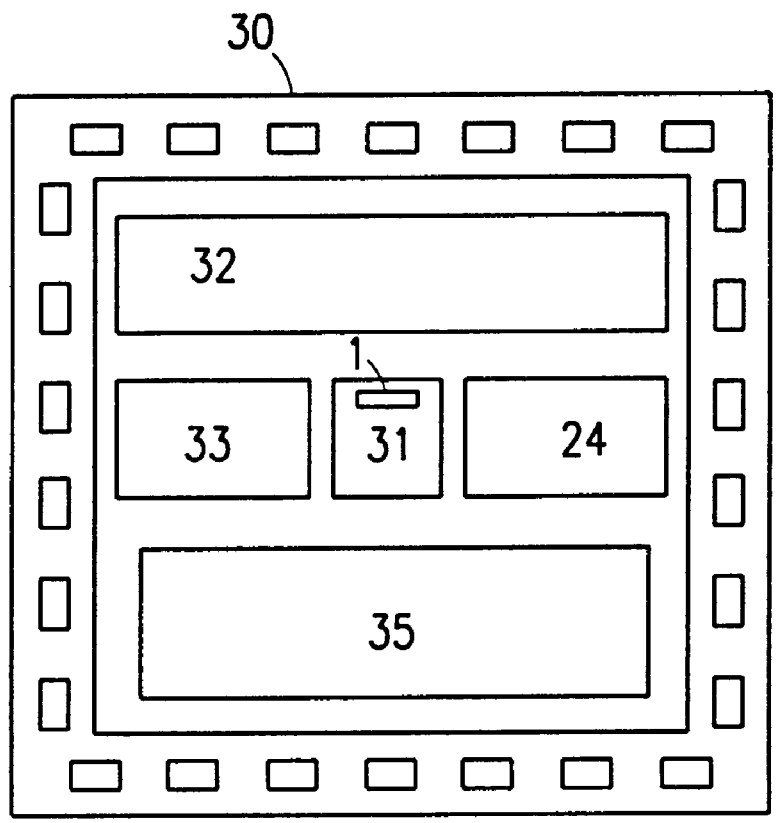
FIG. 6 is a top plan view of an integrated circuit chip having disposed thereon a dynamic memory device according to a preferred embodiment of the present invention.

As stated above, the present invention is particularly suited for dynamic memory devices which are embedded within an integrated circuit fabricated by a process which is not tailored for optimal DRAM performance, such as an ASIC process. FIG. 6 illustrates an ASIC chip 30 having disposed thereon embedded DRAM device 31 (including voltage limiting circuit 1) and other circuitry 32–35 which, when combined, performs a specific application. The voltage limiting circuit 1, when implemented within DRAM device 31, substantially maintains sub-threshold leakage currents within acceptable limits, thereby enhancing the storage handling capability of DRAM device 31.

Although the preferred embodiment of the present invention has been illustrated in the accompanying drawings and described in the foregoing detailed description, it will be understood that the invention is not limited to the embodiments disclosed, but is capable of numerous rearrangements, modifications and substitutions without departing from the spirit of the invention as set forth and defined by the following claims.

What is claimed is:

1. A voltage limiting device for a dynamic random access memory (DRAM) device embedded within an integrated circuit chip, said DRAM device having a memory array of memory cells arranged in rows, and a plurality of bit lines, each bit line being connected to a column of memory cells, said voltage limiting device comprising:

a pull-up device connected to a bit line; and clocking means for coupling said pull-up device to said bit line when said bit line is driven towards a low reference voltage level, to maintain a minimum voltage appearing on said bit line to voltage levels above said low reference voltage level.

2. The device of claim 1, wherein:

said pull-up device comprises a pair of transistors arranged in a series stacked relation, a drain electrode of a first transistor of said transistor pair is connected to a high reference voltage level, and a source electrode of a second transistor of said transistor pair is connected to said bit line.

3. The device of claim 2, wherein:

said transistors are an n-channel field-effect transistors.

4. The device of claim 2, wherein:

said DRAM device includes a pull-down device connected to said bit line for pulling said bit line towards said low reference voltage level; and said first transistor of said pull-up device is sized such that an impedance of said first transistor when coupled to said bit line is greater than an impedance of said pull-down device when said pull-down device is activated.

5. The device of claim 2, wherein:

said DRAM device includes at least one pull-down device coupled to said bit line for selectively driving said bit line towards said low reference voltage level; and said first transistor of said pull-up device is sized to weakly pull up said bit line relative to a drive strength of said pull-down device.

6. The device of claim 2, wherein:

said DRAM device includes at least one sense amplifier connected to said bit line; and said clocking means activates said second transistor of said pull-up device following said sense amplifier initially driving said bit line towards said low reference voltage level.

7. The device of claim 2, further including:

a voltage source connected to a gate electrode of said first transistor and generating a first output voltage signal; and wherein a gate electrode of said second transistor is connected to an output of said clocking means and a drain electrode of said second transistor is connected to a source electrode of said first transistor.

8. The device of claim 7, wherein:

said first output voltage signal is selectively adjustable.

9. The device of claim 1, wherein:

said DRAM device includes a pull-down device connected to said bit line; and said pull-up device forms a voltage divider circuit with said pull-down device when said pull-down device drives said bit line towards said low reference voltage level.

10. The device of claim 9, wherein:

an impedance provided by said pull-up device is greater than an impedance of said pull-down device when said pull-down device is activated such that a minimum voltage appearing on said bit line is greater than said low reference voltage level and within a voltage range corresponding to the logic level to which said low reference voltage level corresponds.

11. The device of claim 10, wherein:

said minimum voltage appearing on said bit line is approximately between 300 mv and 500 mv.

12. The device of claim 1, wherein:

said pull-up device comprises a field effect transistor, a drain electrode of said transistor is connected to a high reference voltage level and a source electrode of said transistor is connected to said bit line.

13. An integrated circuit chip, comprising:

a dynamic random access memory device including:

a memory array of memory cells;

a plurality of bit lines, each said bit line being connected to a column of memory cells;

at least one sense amplifier, said sense amplifier being coupled to a pair of bit lines; and means for maintaining minimum voltages appearing on said bit lines of said bit line pair above a low reference voltage level when said sense amplifier drives either of said bit lines of said bit line pair towards said low reference voltage level.

14. The integrated circuit chip of claim 13, wherein:

said means for maintaining minimum voltages comprises a plurality of pull-up devices, each said pull-up device being connected to a bit line, and means for selectively coupling said pull-up devices to the bit line when a bit line of said bit line pair is driven towards said low reference voltage level.

15. The integrated circuit chip of claim 14, wherein:

each said pull-up device comprises a first transistor having a drain electrode connected to a high reference voltage level, a gate electrode driven by a first voltage signal and a second transistor having a drain electrode connected to a source electrode of said first transistor, a source electrode connected to the bit line and a gate electrode connected to a clock line.

16. The integrated circuit chip of claim 15, further including:

a voltage source which generates the first voltage signal, the first voltage signal being programmably set to a first voltage level.

17. The integrated circuit chip of claim 15, wherein:

a drive strength provided by said pull-up devices is less than a drive strength of said sense amplifier to pull either bit line of said bit line pair towards said low reference voltage level.

18. The integrated circuit chip of claim 15, wherein:

said means for selectively coupling comprises clocking circuitry connected to a control electrode of said pull-up devices.

19. The integrated circuit chip of claim 15, wherein:

each bit line is connected to a distinct pull-up device.

20. The integrated circuit chip of claim 14, wherein:

each said pull-up device comprises a transistor having a drain electrode connected to a high reference voltage level and a source electrode connected to the bit line.

21. The integrated circuit chip of claim 14, further including:

circuitry other than said dynamic random access memory device disposed on said integrated circuit chip such that said dynamic random access memory device is embedded within said integrated circuit chip.

22. A method of utilizing a dynamic random access memory device having an array of memory cells, a plurality of word lines, each said word line being connected to a row of memory cells of said memory cell array, and a plurality of bit lines, each said bit line being connected to a column of memory cells of said memory cell array, said method comprising the steps of:

driving a word line to a first voltage level to connect a row of memory cells to said bit lines;

sensing voltages appearing on said bit lines;

driving at least one of said bit lines towards a low reference voltage level;

driving said word line to a second voltage level to electrically isolate said bit lines from memory cells in said row of memory cells; and clamping a minimum voltage appearing on said at least one bit line above said low reference voltage level when said at least one bit line is driven towards said low reference voltage level.

23. The method of claim 22, wherein:

said step of clamping a minimum voltage includes the step of weakly pulling said at least one bit line towards a high reference voltage level, relative to said driving of said at least one bit line towards said low reference voltage level.

24. The method of claim 22, wherein:

said step of clamping a minimum voltage includes the steps of forming a voltage divider between a high reference voltage level and said low reference voltage level, said voltage divider being connected to said at least one bit line.

25. The method of claim 22, wherein:

said dynamic random access memory device further includes a pull-up circuit connected to said at least one bit line; and said step of clamping a minimum voltage comprises the step of coupling said pull-up circuit to said at least one bit line following initiation of said step of driving said at least one bit line.

* * * * *